(12) United States Patent
Nishio et al.

(10) Patent No.: US 9,524,006 B2
(45) Date of Patent: Dec. 20, 2016

(54) STORAGE APPARATUS AND METHOD OF MANUFACTURING CANISTER HOUSING ENCLOSURE

(71) Applicant: Hitachi, Ltd., Tokyo (JP)

(72) Inventors: Kazuaki Nishio, Tokyo (JP); Toru Kobayashi, Tokyo (JP); Manabu Yamagata, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/762,843

(22) PCT Filed: Mar. 26, 2013

(86) PCT No.: PCT/JP2013/058780
§ 371 (c)(1),
(2) Date: Jul. 23, 2015

(87) PCT Pub. No.: WO2014/155524
PCT Pub. Date: Oct. 2, 2014

(65) Prior Publication Data
US 2015/0370293 A1    Dec. 24, 2015

(51) Int. Cl.
*G06F 1/16*    (2006.01)
*G06F 1/18*    (2006.01)
(Continued)

(52) U.S. Cl.
CPC ............ *G06F 1/187* (2013.01); *G11B 33/128* (2013.01); *H05K 7/1418* (2013.01); *Y10T 29/49828* (2015.01)

(58) Field of Classification Search
CPC ...... G06F 1/187; G11B 33/128; H05K 7/1418
(Continued)

(56) References Cited

U.S. PATENT DOCUMENTS 4,022,326 A * 5/1977 Marconi ............. H05K 7/1418
                                                    211/41.17
6,185,109 B1 * 2/2001 Koradia ............... H05K 7/1425
                                                         174/363
(Continued)

FOREIGN PATENT DOCUMENTS

JP    2005-190052 A    7/2005
JP    2009-53978 A    3/2009

OTHER PUBLICATIONS

International Search Report of PCT/JP2013/058780.

*Primary Examiner* — Nidhi Thaker
(74) *Attorney, Agent, or Firm* — Mattingly & Malur, PC

(57) ABSTRACT

The loading density of canisters fitted to a supporting substrate of a storage enclosure is reduced. A plurality of rail structure bodies are provided in parallel with the Y-axis direction so as to be spaced apart by a first predetermined distance in the X-axis direction. A pair of the rail structure bodies arranged on left and right sides in the Y-axis direction support the canisters. The rail structure body includes first contact parts extended in parallel with the Y-axis direction, second contact parts formed continuously with the first contact parts so as to protrude by a second predetermined distance to one side in the X-axis direction, and coupling parts formed continuously with the first contact parts and the second contact parts. The canister is supported between one side surface of the second contact part of one rail structure body and the other side surface of the contact part.

7 Claims, 12 Drawing Sheets

(51) Int. Cl.
*H05K 7/14* (2006.01)
*G11B 33/12* (2006.01)

(58) Field of Classification Search
USPC .......... 361/679.31–679.39; 312/223.1, 223.2
See application file for complete search history.

(56) References Cited

U.S. PATENT DOCUMENTS

| | | | | |
|---|---|---|---|---|
| 6,282,087 | B1* | 8/2001 | Gibbons | G06F 1/187 |
| | | | | 361/679.32 |
| 6,317,329 | B1* | 11/2001 | Dowdy | H05K 7/1418 |
| | | | | 312/223.3 |
| 6,396,690 | B1* | 5/2002 | Blatti | G06F 1/184 |
| | | | | 211/41.17 |
| 6,480,391 | B1* | 11/2002 | Monson | H05K 7/1425 |
| | | | | 312/223.1 |
| 6,661,667 | B2* | 12/2003 | Robbins | G06F 1/183 |
| | | | | 312/223.2 |
| 7,170,755 | B2* | 1/2007 | Keller | H05K 7/1454 |
| | | | | 361/727 |
| 7,672,139 | B2* | 3/2010 | Joist | H05K 7/1418 |
| | | | | 361/752 |
| 8,498,104 | B2* | 7/2013 | Lin | G06F 1/187 |
| | | | | 312/223.2 |
| 2005/0141184 | A1 | 6/2005 | Suzuki et al. | |
| 2006/0133054 | A1* | 6/2006 | Haag | H05K 7/1418 |
| | | | | 361/756 |
| 2009/0059520 | A1 | 3/2009 | Tanaka et al. | |

* cited by examiner

Fig. 5
(a)
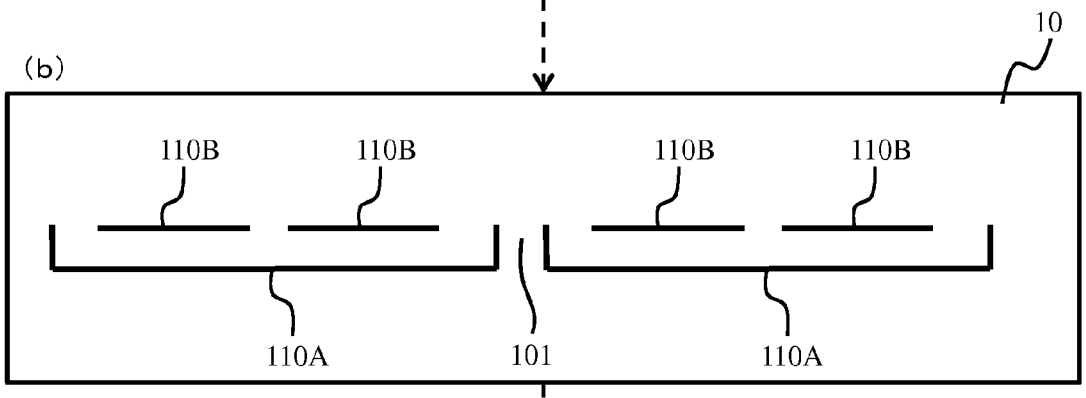
(b)
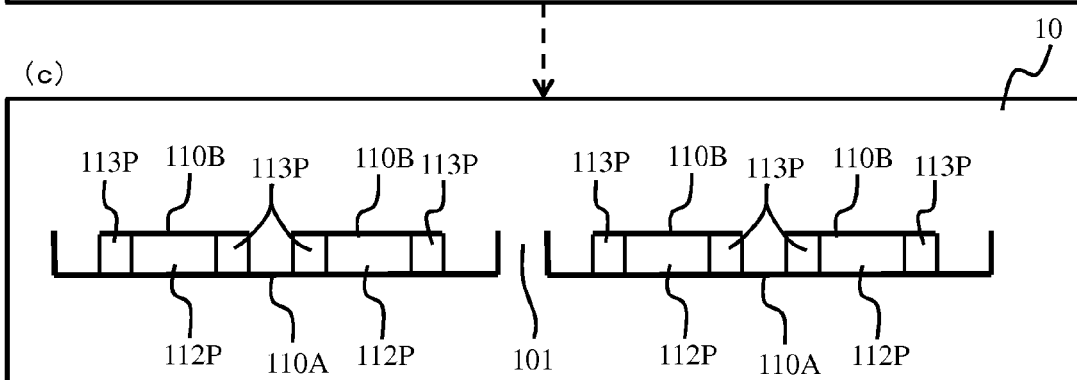
(c)
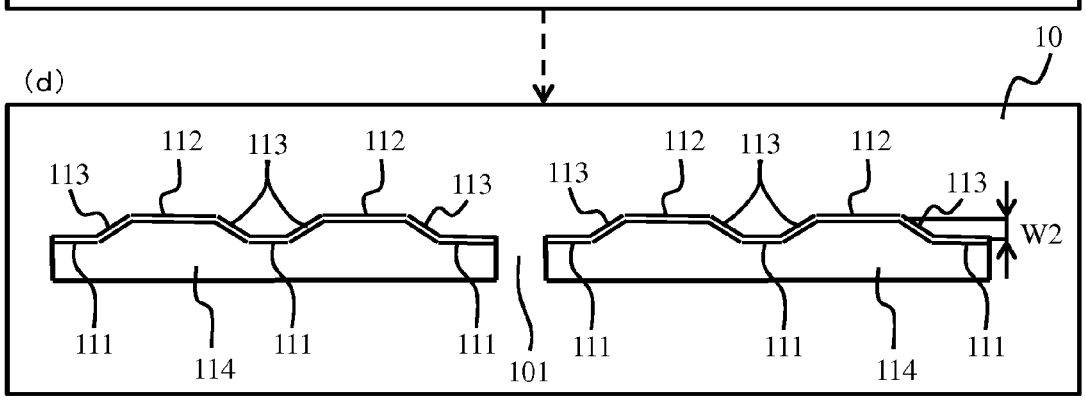
(d)

STORAGE APPARATUS AND METHOD OF MANUFACTURING CANISTER HOUSING ENCLOSURE

TECHNICAL FIELD

The present invention relates to a storage apparatus and a method of manufacturing a canister housing enclosure.

BACKGROUND ART

A plurality of canisters for housing storage media are detachably fitted to the enclosures of a storage apparatus (PTL 1, 2). When rail structures for fitting canisters are manufactured by a die-casting system suitable for mass production, the rail structures can be manufactured by matching the dimension of canisters, and a large number of canisters can be housed in the enclosures.

CITATION LIST

Patent Literature

[PTL 1]
 Japanese Patent Application Laid-open No. 2009-053978
[PTL 2]
 Japanese Patent Application Laid-open No. 2005-190052

SUMMARY OF INVENTION

Technical Problem

The manufacturing of a canister-fitting rail structure by the die-casting system requires an expensive mold and many materials, resulting in the increase of manufacturing cost. To cope with this situation, manufacturing of the canister-fitting rail structure by sheet-metal processing which is suitable for small-lot production can be also considered.

However, because a sheet metal is thin, two cut-and-bent sections need to be formed laterally on one canister, to secure a predetermined gap between canisters. This configuration lowers the loading density in the lateral direction of the canisters.

Therefore, there can be also considered a configuration that meets a narrow rail structure by forming cut-and-bent sections between the canisters and by providing a longitudinally-movable adapter on the bottom portion of each canister. However, in this case, a height dimension of the canister increases by the thickness of the adapter, and the loading density in the vertical direction cannot be set high.

With the foregoing in view, it is an object of the present invention to provide a storage apparatus and a method of manufacturing a canister housing enclosure capable of improving the loading density of canisters at relatively low cost.

Solution to Problem

To solve the above problem, the storage apparatus according to the present invention is a storage apparatus that includes an enclosure having an opening part on an end at one side in a first direction, a supporting substrate which is provided in the enclosure and to which at least one canister for housing storage media is insertably and removably fitted, and supporting structures spaced apart by a first predetermined distance in a second direction orthogonal with the first direction on the same plane, integrally formed on the supporting substrate in parallel with the first direction, and configured to support the canisters that are inserted and removed via the opening part. Each of the supporting structures includes a first contact part extended in parallel with the first direction, a second contact part continuously and integrally formed with the first contact part so as to be protruded by a second predetermined distance toward one side in the second direction, and a coupling part positioned at both ends of the second contact part in the first direction, continuously and integrally formed with the first contact part and the second contact part, and configured to couple the first contact part to the second contact part. The canister is configured to be supported between one side surface of the second contact part of one supporting structure and the other side surface of the first contact part of the other supporting structure adjacent to the one supporting structure.

BRIEF DESCRIPTION OF DRAWINGS

FIG. 5 is a schematic explanatory diagram of a manufacturing process of rail structures.

FIG. 7(a) shows a diagrammatic perspective view of the base enclosure in a state that canisters are removed, and FIG. 7(b) shows a plan view of the base enclosure.

DESCRIPTION OF EMBODIMENTS

Hereinafter, an embodiment of the present invention is explained with reference to the drawings. In the present embodiment, by molding a sheet metal, one or a plurality of protrusion parts that are protruded in a lateral direction are formed in the middle of a panel-shaped rail structure that extends in a longitudinal direction of an enclosure. With this configuration, as compared with the case of simply bending a sheet metal, a thickness in the lateral direction can be enlarged.

Further characteristics of the present invention will become more clear from the description of the present invention and the appended drawings. The description of the present specification is no more than a representative exemplification, and by no means limit the range of claims or application examples of the present invention.

Example 1

Hereinafter, an example of the present embodiment is explained with reference to the drawings. As shown in FIG. 1(a), one base enclosure 2 and a plurality of Expansion Enclosures 3 are detachably housed in a rack 1. The base enclosure 2 includes main functions of a storage system such as a control function and a storage function in one enclosure, and controls data input to and output from each Expansion Enclosure 3. On the other hand, each Expansion Enclosure 3 includes only a storage function, and is controlled by the base enclosure 2.

Figure 1:
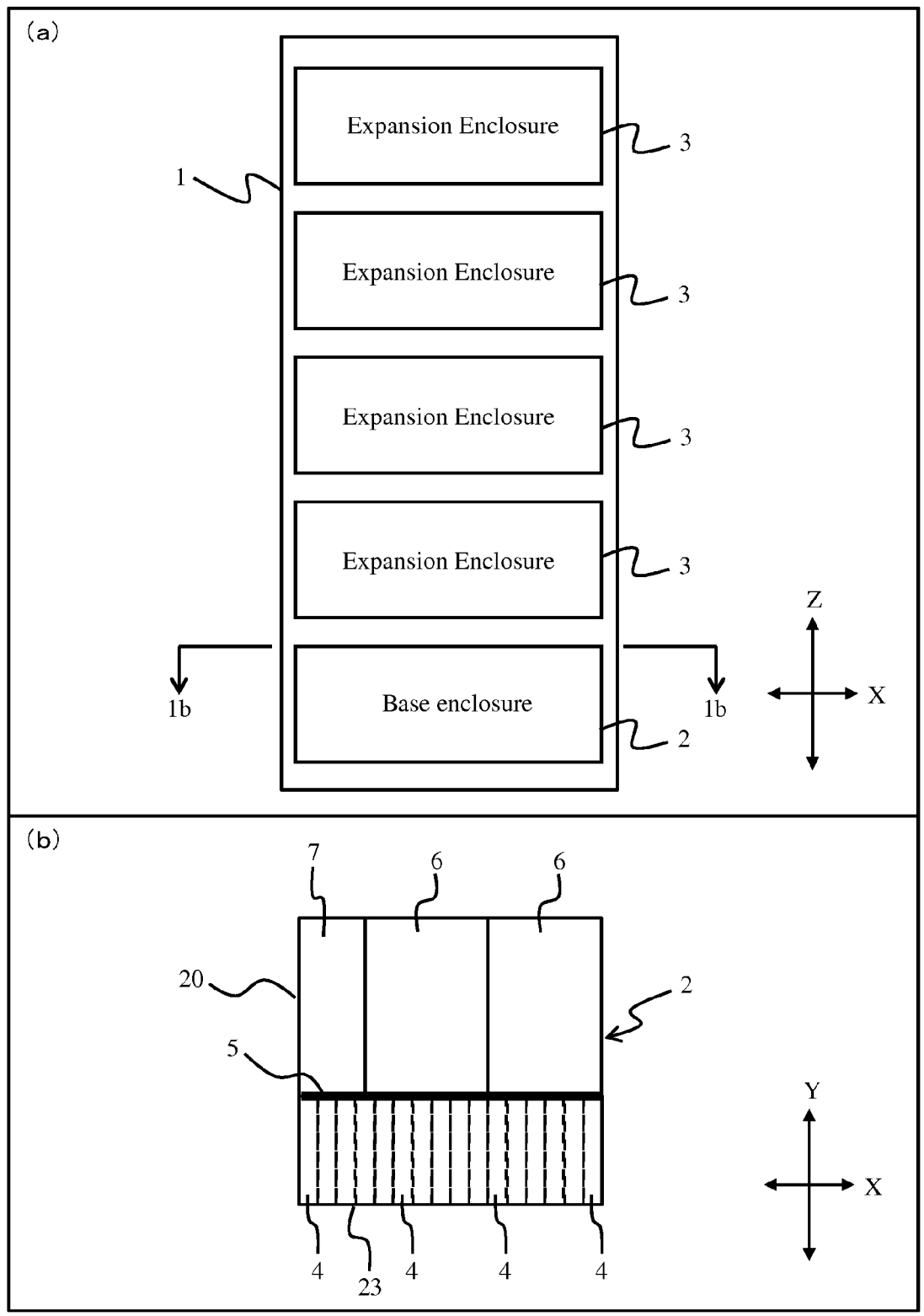
FIG. 1(a) shows a front view of a rack that houses a base enclosure and Expansion Enclosures.
FIG. 1(b) shows a plan view of the base enclosure.

In the present example, a first direction is a Y-axis direction in FIG. 1(b), for example, and is also called a longitudinal direction. A second direction is an X-axis direction in FIG. 1, for example, and is also called a left-and-right direction, or a lateral direction, or a width direction. A third direction is a Z-axis direction in FIG. 1(a), for example, and is also called an up-and-down direction or a vertical direction.

As shown in FIG. 1(b), a plurality of canisters 4 are arranged in the left-and-right direction at the front side of the base enclosure 2. A width dimension of an upper part of the canister 4 is different from a width dimension of a bottom part of the canister 4, and the canister 4 is configured to be unable to be inserted in an upside-down state.

At a rear side of the base enclosure 2, a plurality of control substrates 6 and a plurality of power source apparatuses 7 are provided. Because the power source apparatuses 7 are stacked perpendicularly, only one power source apparatus 7 is shown in FIG. 1(b). The control substrates 6 and the power source apparatuses 7 are configured to be redundant, so that when one apparatus is in trouble, the other apparatus can back up.

The control substrate 6 includes a host-side communication function, a drive-side communication function, a cache memory function, and a control function, for example. The host-side communication function is a function for communicating with a host computer via a communication path using the internet, a LAN (Local Area Network), and an FC-SAN (Fibre Channel-Storage Area Network), for example. Commands and the like issued from the host computer are received by the host-side communication function, and are delivered to the control function.

Figure 8:
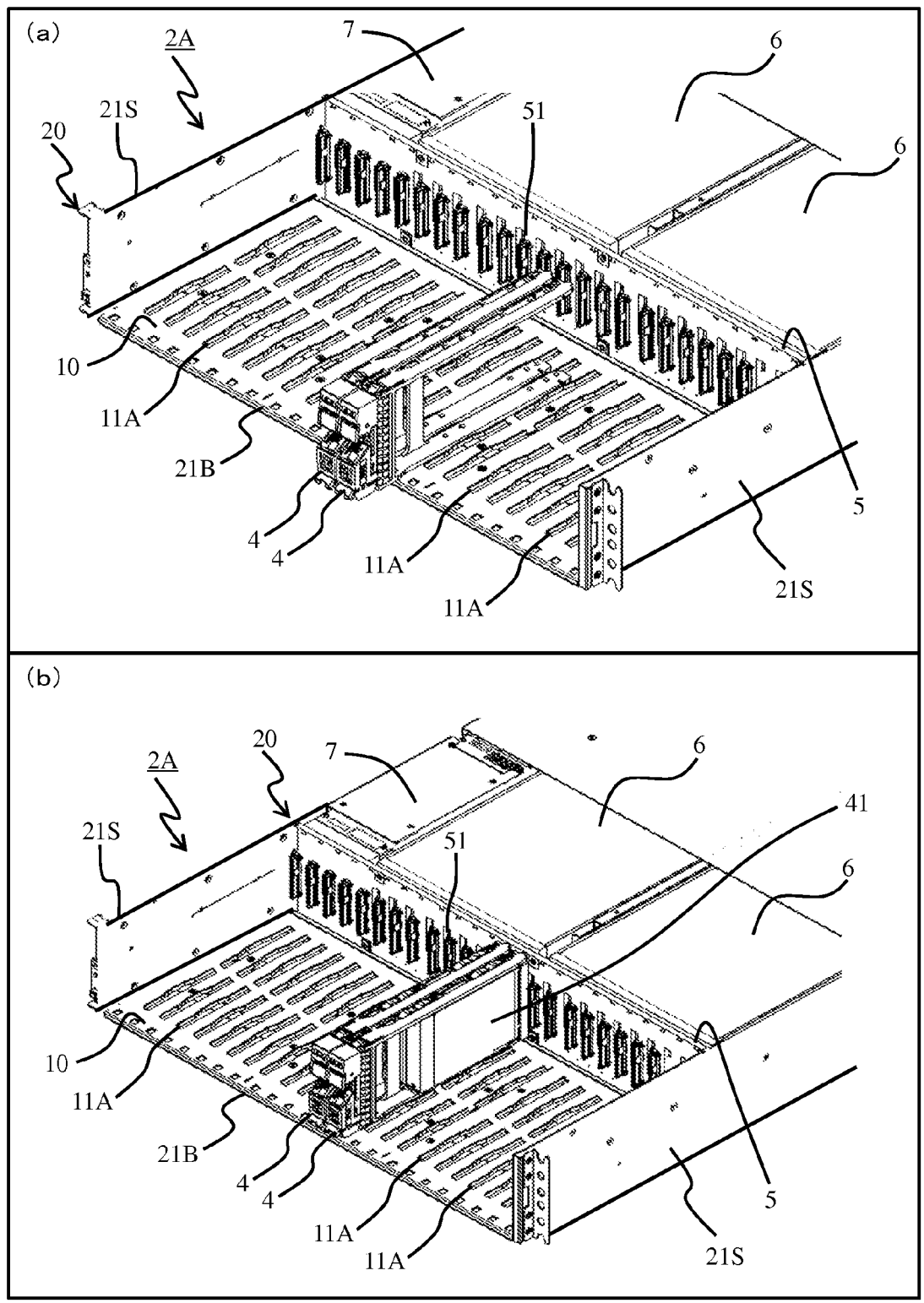
FIG. 8(a) is a diagrammatic perspective view showing a state that canisters from which hard disc drives are removed are mounted on the base enclosure.
FIG. 8(b) is a diagrammatic perspective view showing a state that canisters having hard disc drives are fitted to the base enclosure.
Figure 9:
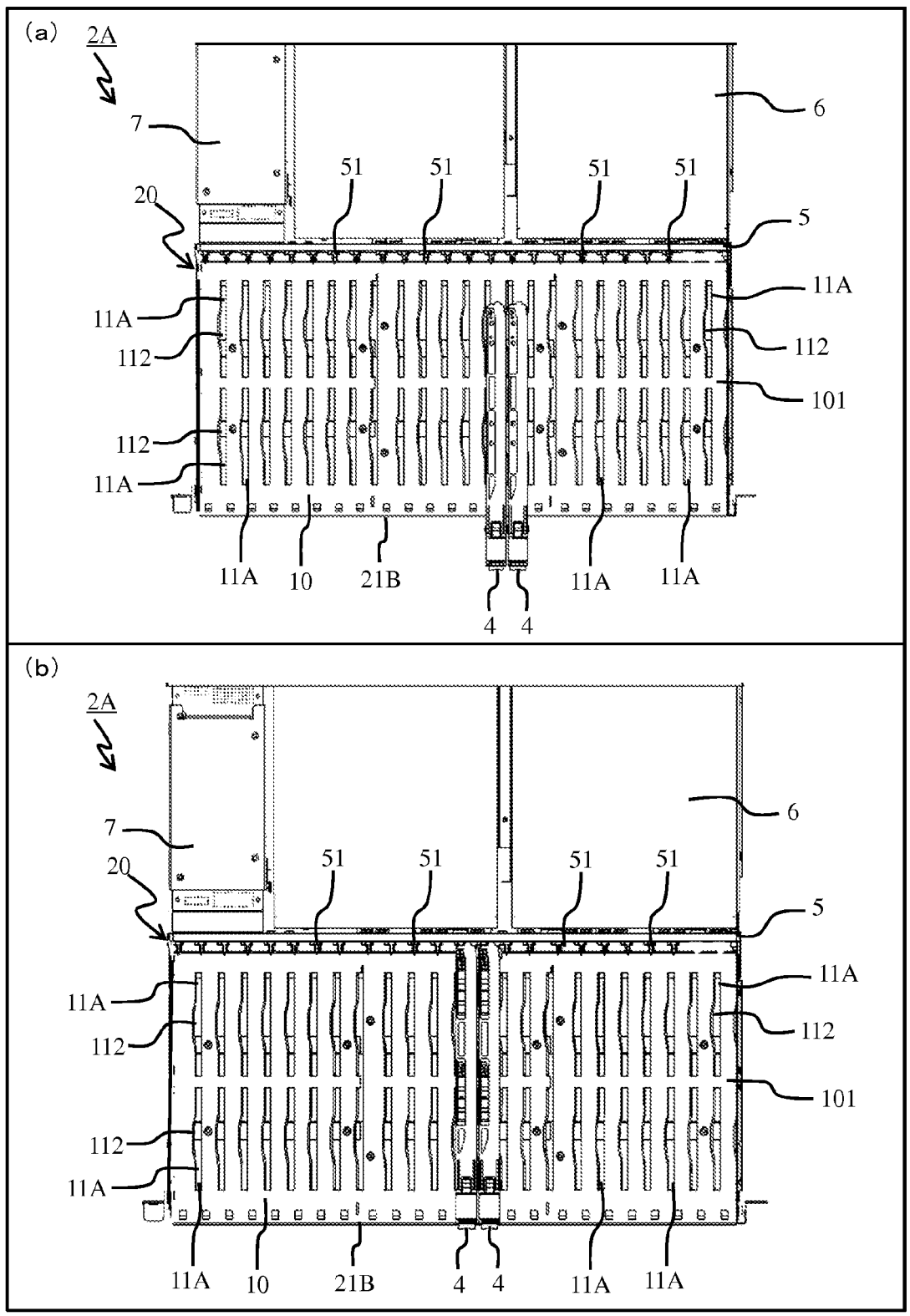
FIG. 9(a) shows a plan view corresponding to FIG. 8(a)
FIG. 9(b) shows a plan view corresponding to FIG. 8(b).

The drive-side communication function is a function for communicating with each hard disc drive 41 (see FIG. 8(b)) in the base enclosure 2 and with each hard disc drive in the Expansion Enclosure 3. While a hard disc is taken up as an example of a storage medium in this case, the storage medium is not limited to the hard disc. For example, various storage media can be also used such as a semiconductor memory, an optical disc, a magnetic optical disc, a flash memory, an FeRAM (Ferroelectric Random Access Memory), an MRAM (Magnetoresistive Random Access Memory), a phase-change memory (Ovonic Unified Memory), and a RRAM (registered trademark). Further, while a configuration of arranging the canisters 4 laterally by only one stage in the base enclosure 2 is exemplified, the configuration is not limited to this example, and canisters in a lateral row may be arranged in two or more stages by stacking.

The cache memory function is a function for temporarily storing data to be transmitted and received between the control substrate 6 and the host computer and data to be transmitted and received between the control substrate 6 and the storage medium.

The control function is a function for executing a processing following various commands such as a write command and a read command received from the host computer, and for returning a processed result to the host computer. In the case of the write command, the control function writes write data received from the host computer into a storage medium (hard disc drive 41) corresponding to a storage area assigned by the write command. In the case of the read command, the control function reads data assigned by the read command from a storage medium corresponding to a storage area assigned by the read command, and transmits the read data to the host computer. Further, the control function can also perform power source management for stopping power conduction to a storage medium which has not been accessed for a certain period of time or longer.

Figure 2:
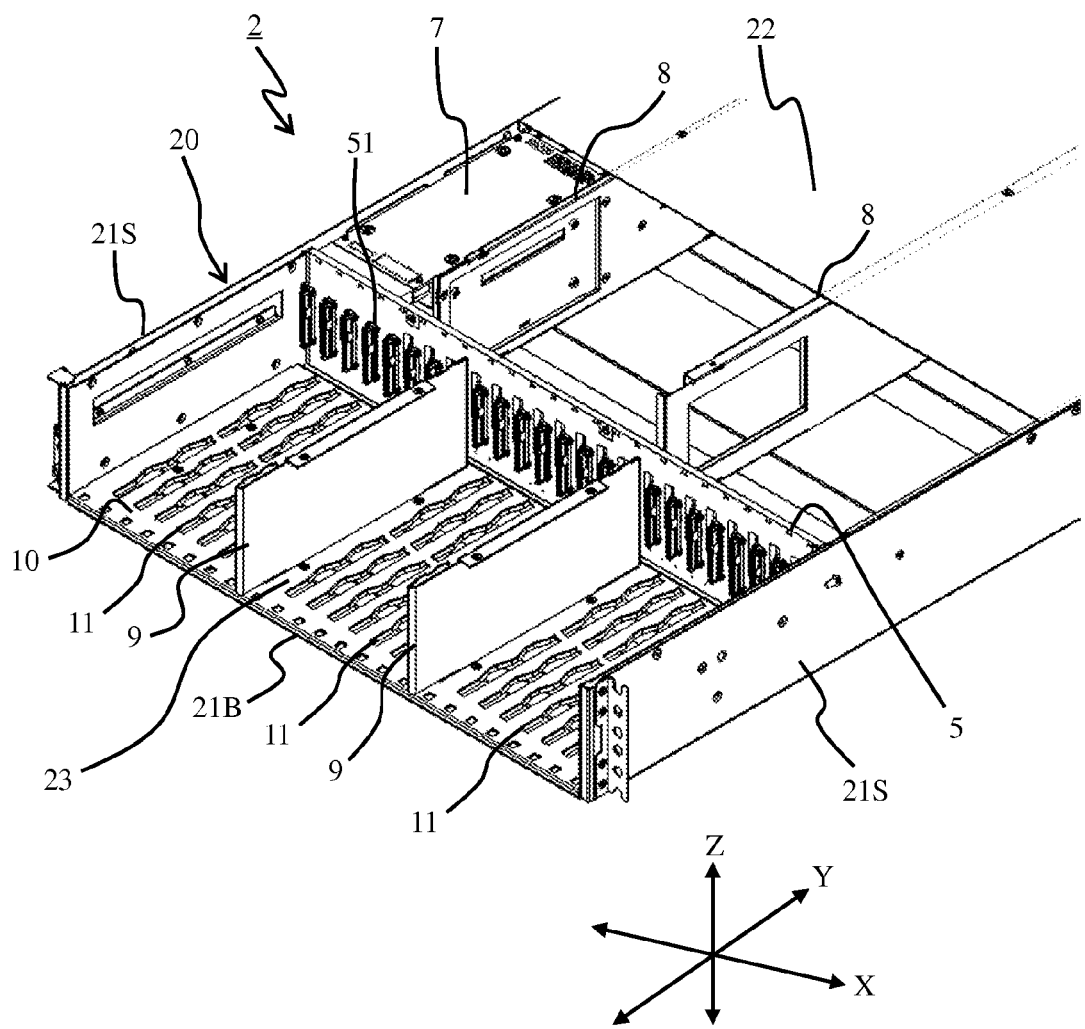
FIG. 2 is a diagrammatic perspective view of the base enclosure in a state that canisters and control substrates are removed.

FIG. 2 is a diagrammatic perspective view in a state that the canisters 4 are removed and also a case cover 22 is opened. A case 20 as an example of the "enclosure" is formed of a bottom part 21B, and side surface parts 21S that are perpendicularly integrally formed from left and right end sides of the bottom part 21B, and an upper part of the case 20 is covered with the case cover 22 that is detachable.

An opening part 23 is formed at a front side of the case 20, and the canisters 4 are fitted to the inside of the case 20 by insertion from the opening part 23. After the canisters 4 are pushed to predetermined positions in the case 20, connectors (not shown) of the hard disc drives 41 mounted on the canisters 4 are electrically connected to connectors 51 of coupling substrates 5.

That is, each canister 4 is inserted into the case 20 by a user until when the connector of the hard disc drive 41 is engaged with the connector of the coupling substrate 5. The user can also extract the canister 4 from the inside of the case 20 by holding and pulling a knob formed at a front side of the canister 4. A structure for supporting the canister 4 from a lower side is described later.

In a front-side area of the case 20, a plurality of (two) supporting plates 9 are provided so as to be spaced apart from each other in the left-and-right direction. Also in a rear-side area of the case 20, a plurality of (two) supporting plates 8 are provided so as to be spaced apart from each other in the left-and-right direction. These front and back supporting plates 8, 9 support the case cover 22 from a lower side.

Figure 3:
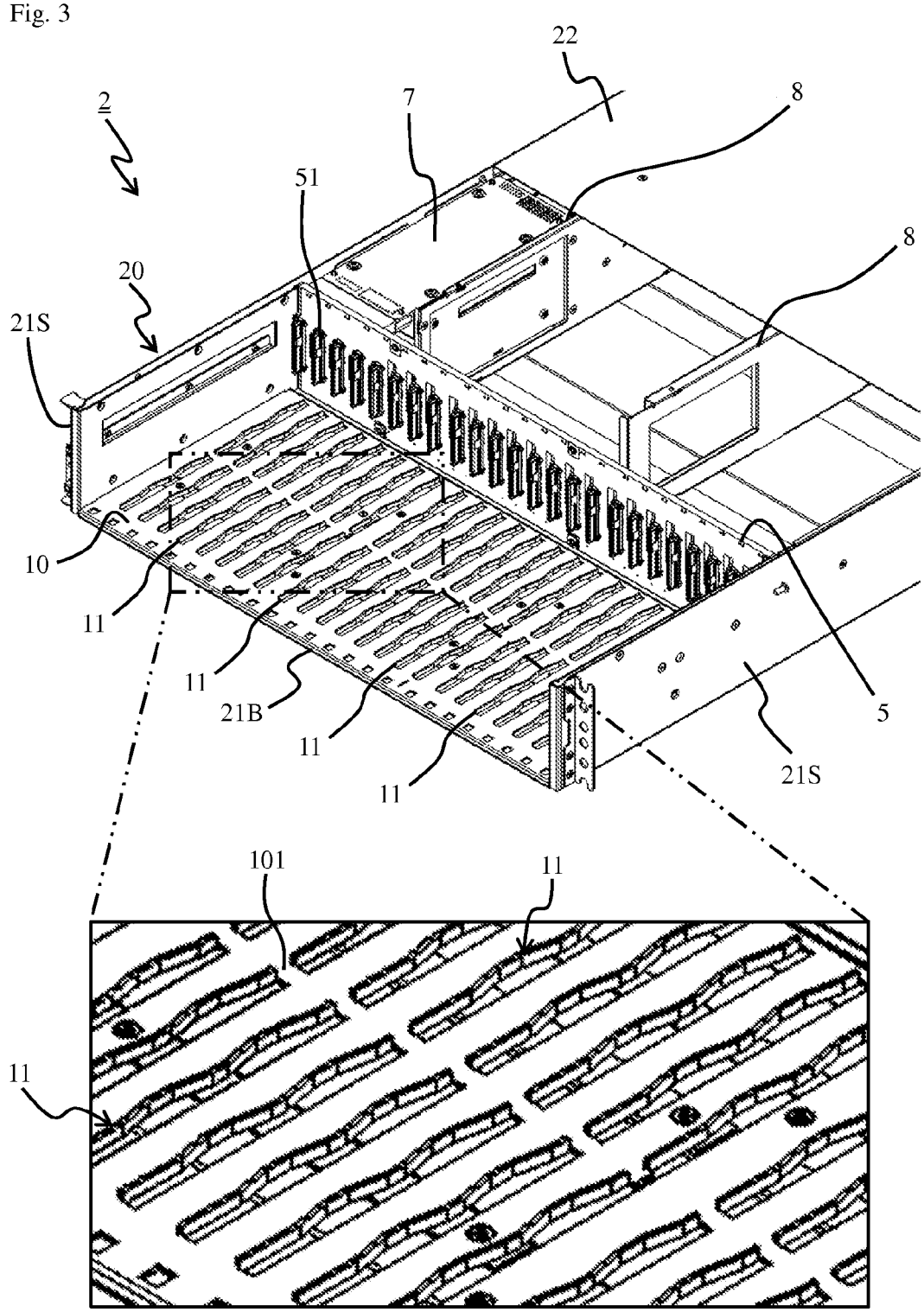
FIG. 3 is an enlarged diagrammatic perspective view of a rail structure that supports canisters.

As shown by a diagrammatic perspective view and a partially-enlarged view in FIG. 3, a supporting substrate 10 is fitted to an upper surface of the bottom part 21B of the case 20. On the supporting substrate 10, by molding a sheet metal, a plurality of rail structure bodies 11 are provided so as to be spaced apart from each other in the left-and-right direction as an example of the "supporting structure". Alternatively, the supporting substrate 10 and the bottom part 21B of the case 20 may be commonly used. That is, the rail structure bodies 11 may be configured to be directly formed on the bottom part 21B of the case 20.

Figure 4:
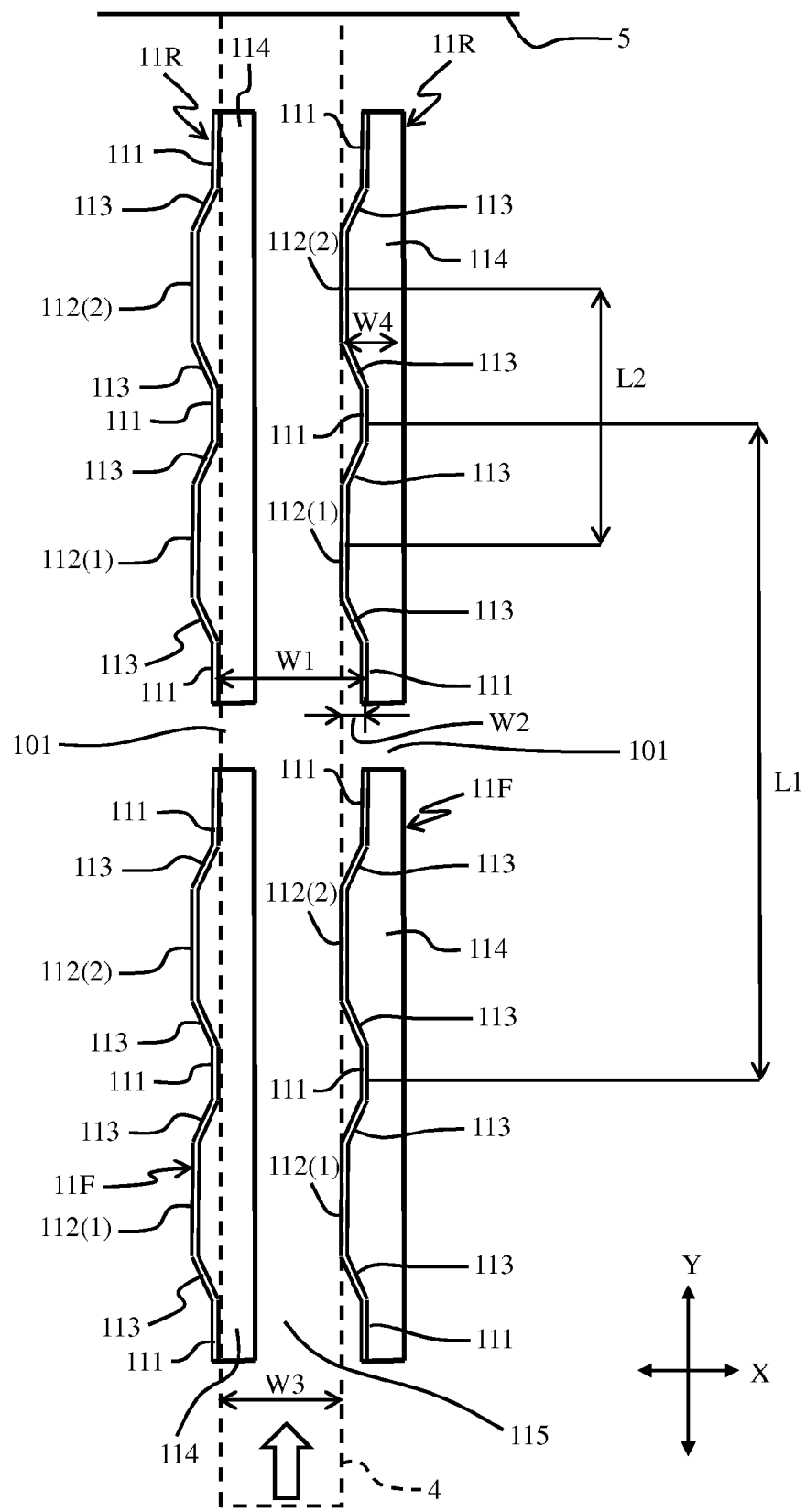
FIG. 4 is a plan view showing a plurality of adjacent rail structures.

FIG. 4 is an enlarged plan view showing two sets of mutually adjacent rail structure bodies 11. In FIG. 4, a plurality of (two, for example) rail structure bodies 11 are arranged in one straight line with a predetermined pitch L1 in the longitudinal direction (Y-axis direction).

One set are formed of a plurality of rail structure bodies 11 arranged longitudinally. A set of rail structures are formed of front-side rail structure bodies 11F positioned at an opening part 23 side and rear-side rail structure bodies 11R positioned at a coupling substrate 5 side. Each set of the rail structure bodies 11 are integrally formed with the supporting substrate 10 with a first predetermined distance W1 between the rail structure bodies 11 in the left-and-right direction.

A configuration of the rail structure body 11 is explained. The rail structure body 11 is configured to include a first contact part 111, a second contact part 112, and a connection part 113. The first contact part 111 is formed in a plate shape extending in the longitudinal direction. The second contact part 112 is continuously and integrally formed from an end of the first contact part 111 so as to be protruded by a second predetermined distance W2 to one side (a left side in the example of FIG. 4) in the left-and-right direction from the first contact part 111. A plurality of (two, for example) the second contact parts 112 are provided so as to be spaced apart from each other by a predetermined pitch L2.

The connection parts 113 are positioned at both ends of the second contact part 112, and are diagonally integrally formed to couple the second contact part 112 to the first contact part 111. Viewed from an upper surface, the second contact part 112 and the connection parts 113 at both ends of the second contact part 112 form a trapezoidal shape.

That is, the second contact part 112 is formed by partially deforming a predetermined portion of the flat first contact part 111 and by protruding the deformed part to one side in the left-and-right direction. The second contact part 112 can be also called a bridge, a stage, and a protrusion part.

A through-hole 114 is generated when the supporting substrate 10 is pressed with a predetermined mold. When a portion that buries the through-hole 114 is cut and bent perpendicularly to the paper surface of FIG. 4, the rail structure body 11 is integrally formed on the supporting substrate 10.

In the example shown in FIG. 4, one rail structure body 11 includes a plurality of (two, for example) second contact parts 112(1) and 112(2) in order from a front side in the longitudinal direction. Out of the plurality of the second contact parts 112(1) and 112(2) of the front-side rail structure body 11, the most front-side second contact parts 112(1) are first brought into contact with the canister 4 at the time of fitting the canister 4 to the base enclosure 2. Out of the plurality of the second contact parts 112(1) and 112(2) of the rear-side rail structure bodies 11, the most rear-side second contact parts 112(2) are last brought into contact with the canister 4 at the time of fitting the canister 4 to the base enclosure 2.

The second contact parts 112(1) which are first contacted at the time of fitting the canister 4 are also called opening-part side second contact parts 112(1). The second contact parts 112(2) which are last contacted at the time of fitting the canister 4 are also called coupling-substrate side second contact parts 112(2).

As described later with reference to FIG. 6(b), at the time of fitting the canister 4, a front end of the canister 4 is brought into contact with the connection part 113 formed at a front side of the opening-part side second contact part 112(1) (lower side in FIG. 4). The connection part 113 positioned nearest to the opening-part side diagonally guides the canister 4 toward the opening-part side second contact part 112(1). The connection part 113 at the opening part 23 side has a function for guiding the canister 4 to correctly enter a path 115 described later.

The path 115 through which the canister 4 moves is provided between left and right adjacent rail structure bodies 11. A width dimension W3 of the path 115 is nearly identical to the width dimension of the canister 4. That is, the width dimension W3 of the path 115 is equal to a value obtained by adding a slight margin to the width dimension of the canister 4. Hereinafter, description is performed on the assumption that the width dimension W3 of the path 115 is substantially identical to the width dimension of the canister 4.

The width dimension W3 of the path 115 is equal to a value obtained by subtracting a second predetermined distance W2 that is a protrusion volume of the second contact part 112 from the first predetermined distance W1 that is a formation pitch of the rail structure body 11 (W3=W1−W2). A predetermined gap W4 is formed between adjacent canisters 4. The gap W4 is a dimension from a position of a cut-and-bent disconnection line 110A (see FIG. 5) to a perpendicularly-bent second contact portion 12.

The canister 4 is supported between the rail structure bodies 11 that are adjacent in the left-and-right direction. Specifically, the canister 4 is supported in surface contact from left and right sides, based on the other side surface (right side surface in FIG. 4) of the first contact part 111 of the rail structure body 11 at one side (left side in FIG. 4) and one side surface (left side surface in FIG. 4) of the second contact part 112 of the rail structure body 11 at the other side (right side in FIG. 4).

When the connector of the hard disc drive 41 of the canister 4 is electrically connected to the connector 51 of the coupling substrate 5 by engagement, at least a part of the rail structure body 11 positioned at the coupling substrate 5 side fulfills a positioning function for positioning the canister 4.

Specifically, the coupling-substrate side second contact part 112(2), and the first contact part 111 corresponding to the coupling-substrate side second contact part 112(2) out of the first contact parts 111 of an adjacent rail structure body 11 determines a position by supporting the canister 4 from both sides. With this configuration, the connector of the hard disc drive 41 is accurately engaged with the connector 51 of the coupling substrate 5.

An example of a method of manufacturing the rail structure body 11 is explained with reference to FIG. 5. A case of forming a set of the rail structure bodies 11 on a sheet metal is explained as an example with reference to FIG. 5. In the present embodiment example, as described below, a plurality of the rail structure bodies 11 are integrally formed on the supporting substrate 10 by pressing the supporting substrate 10 made of a sheet metal, with a mold of a predetermined shape.

First, as shown in FIG. 5(a), the supporting substrate 10 made of the sheet metal is prepared, and is set in a press molding machine.

FIG. 5(b) shows a cut-forming process as an example of a "first process". In the cut-forming process, cuts 110A and 110B necessary to subsequently form the second contact parts 112 and others are formed. One cut 110A is a disconnection line for bending the rail structure body 11 perpendicularly to the supporting substrate 10. The cuts 110A are formed on the supporting substrate 10 along the longitudinal direction, and both ends are bent substantially perpendicularly to the left side (upper side in FIG. 5) in the left-and-right direction. The other cut 110B is a disconnection line for forming the second contact part 112 and the connection part 113 by pressing the supporting substrate 10 from the rear surface to the front surface.

FIG. 5(c) shows a press deformation process as a "second process". In the press deformation process, the supporting substrate 10 formed with the cuts 110A and 110B in predetermined shapes is deformed by pressing from the rear surface, thereby forming the rail structure bodies 11 before the perpendicularly bending. By pressing the supporting substrate 10 from the rear surface (rear surface of the sheet in FIG. 5), portions 112P that become the second contact parts 112 in future and portions 113P that become the connection parts 113 in future are formed. An area between the portions 113P that become the coupling parts is a flat area that is not press-deformed, and this flat portion becomes the first contact part 111 in future.

FIG. 5(d) shows a bending process as a "third process". In the bending process, the rail structure bodies 11 are bent perpendicularly to the supporting substrate 10. Portions that become the first contact parts 111 are cut at only one side in the left-and-right direction, and are continuous to the supporting substrate 10 at the other side. In the bending process, the rail structure bodies 11 are formed, by perpendicularly bending the portions that become the rail structure bodies 11 in future, to the portions that are continuous to the supporting substrate 10 (upper side in FIG. 5).

Figure 6:
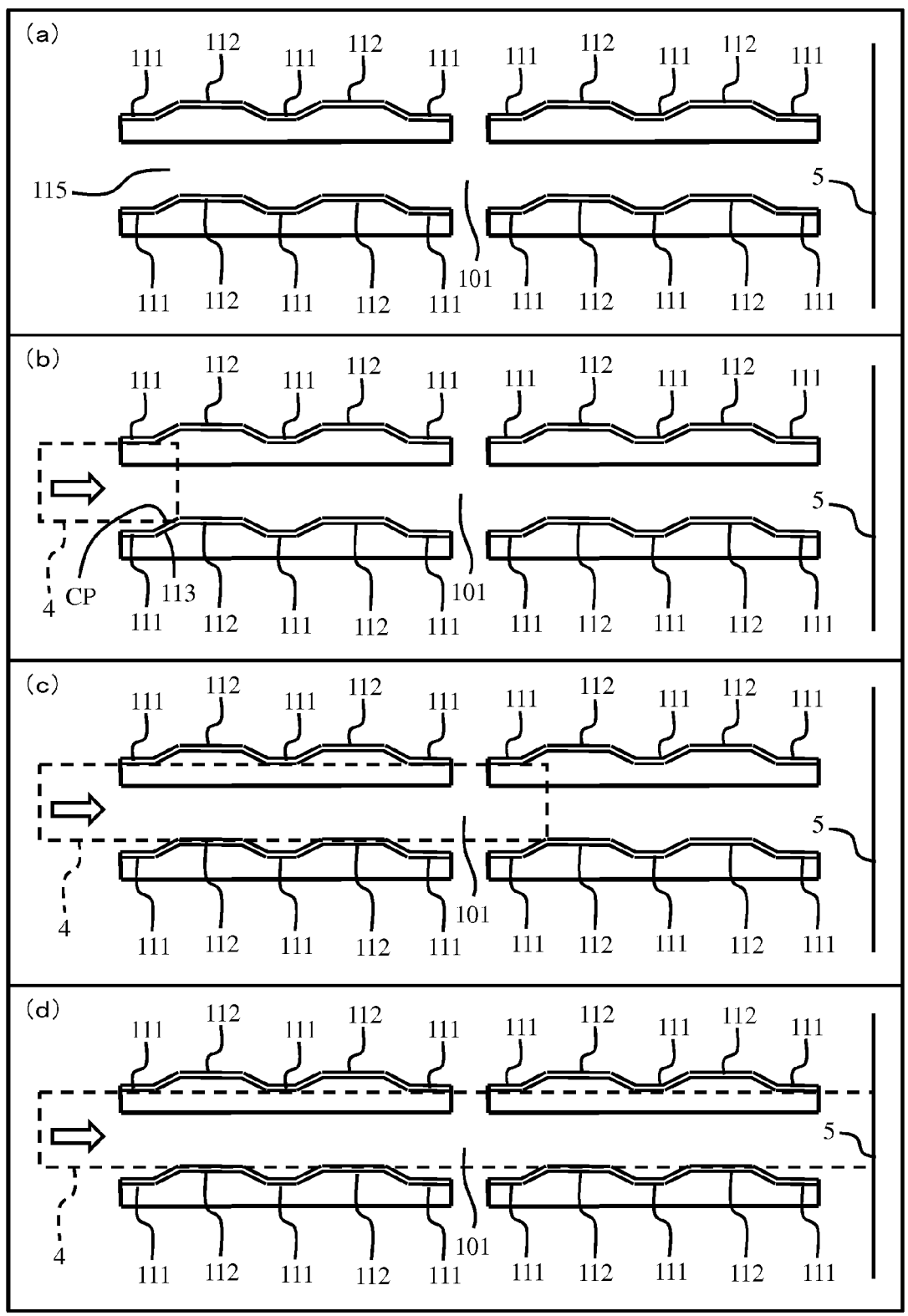
FIG. 6 is an explanatory diagram showing a state of fitting canisters to the rail structure by insertion.
Figure 7:
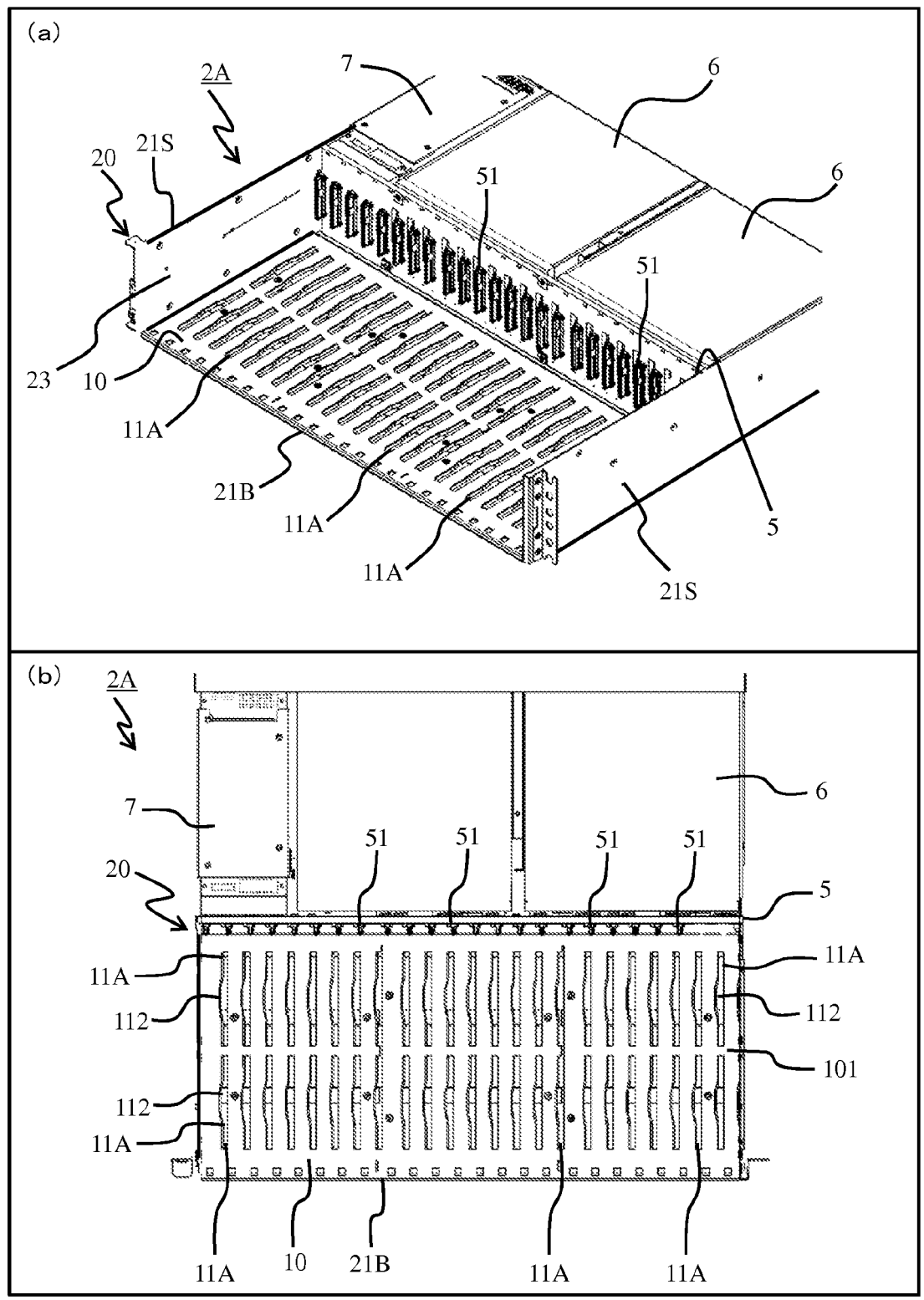
FIG. 7 relates to a second example.

FIG. 6 schematically shows a state of fitting the canisters 4 to the coupling substrate 5 by inserting the canisters 4 into the path 115 formed by a left-and-right pair of rail structure bodies 11.

FIG. 6(a) shows an initial state before inserting the canisters 4. The left-and-right direction in FIG. 6 corresponds to a Y direction shown in FIG. 1, FIG. 4 or the like. The canisters 4 are inserted from a left side in FIG. 6.

FIG. 6(b) shows a state immediately after inserting the canisters 4 into the path 115. A front right end CP viewed from an insertion direction of the canisters 4 is in contact with the connection part 113 nearest to the opening part, and the canisters 4 are guided to the path 115.

FIG. 6(c) shows a state that the canisters 4 entered to about the middle of the path 115 between the pair of rail structure bodies 11. The canisters 4 proceed through the path 115 while being sandwiched between the second contact part 112 of the rail structure body 11 at one side and the first contact part 111 of the rail structure body 11 at the other side.

FIG. 6(d) shows a state that the canisters 4 are fitted to the coupling substrate 5 in contact with the coupling substrate 5. In this state, the hard disc drives 41 of the canisters 4 are electrically connected to the connector 51 of the coupling substrate 5. The hard disc drives 41 are electrically connected to the control substrate 6 via a printed wiring and the like formed on the connector 51 and the coupling substrate 5.

In the present example configured in this way, a plurality of the rail structure bodies 11 having protrusion parts 112 protruded toward the rear surface side of another adjacent rail structure bodies 11 are integrally formed on a sheet-metal shaped supporting substrate 10 by bridge processing the sheet metal. Accordingly, in the present example, in comparison with a configuration of simply cutting and bending in a flat panel shape, the thickness dimension W2 of one rail structure body 11 can be enlarged.

In the configuration of simply cutting and bending in a flat panel shape, the sheet metal needs to be cut and bent at two positions to secure a predetermined gap between the canisters 4. To cut and bend at adjacent two positions, a machining allowance (additional cut off portion) is necessary, and therefore, the canisters 4 cannot be installed in high density in the width direction (X-axis direction). On the other hand, in the present example, because the stage 112 is formed by bridge processing for one cut-and-bent portion, the sheet metal is not required to be additionally cut off, and a large number of canisters 4 can be detachably housed in a width direction.

To avoid the problem of the machining allowance, forming a rail structure by one flat cut-and-bent portion is also considered as an alternative solution. However, because the sheet metal is thin, it is not possible to secure a gap of a necessary dimension between the canisters (in the case of the present example). Therefore, in this case, the canisters are receded by using an adapter provided on a bottom part of each canister. Accordingly, a height dimension of the canisters becomes large at a portion of the bottom part where the adapter is mounted. On the other hand, in the present example, the canisters 4 can be insertably and removably supported without using a special part such as the adapter.

Further, in the present example, the rail structure bodies 11 are manufactured by bridge processing the sheet metal, instead of manufacturing the rail structure bodies 11 by die casting. Accordingly, the present method can be suitably applied to the base enclosures 2 of which production volume is smaller than that of the Expansion Enclosures 3.

As described above, because the base enclosure 2 is a basic apparatus for controlling a storage system, only one base enclosure is sufficient in one storage system, and it is not necessary to provide a plurality of base enclosures unlike the Expansion Enclosures 3. Therefore, a production volume of the base enclosures 2 is smaller than that of the Expansion Enclosures 3.

Further, because the base enclosure 2 is mounted with the canisters 4 in one area and is mounted with the control substrate 6 and others in the other area, the structure of the base enclosure 2 is different from that of the Expansion Enclosure 3. Therefore, the rail structure bodies for the Expansion Enclosures manufactured by die casting cannot be used for the base enclosure 2.

Because the production volume of the base enclosures 2 is smaller than that of the Expansion Enclosures 3 for the above reason, employment of the die-casting system suitable for mass production results in a high manufacturing cost of the base enclosures 2. On the other hand, in the present example, because the rail structure bodies 11 are manufactured by using a sheet-metal processing technology suitable for small-lot production, the increase in the manufacturing cost can be suppressed when this technology is employed for the base enclosures 2 of which production volume is small.

In the present example, because a set of rail structure bodies 11 are arranged so as to be spaced apart from each other in the longitudinal direction (Y-axis direction), a coupling part 101 can be formed at a position between the front-side rail structure bodies 11F and the rear-side rail structure bodies 11R, on the supporting substrate 10. Therefore, even when a plurality of the rail structure bodies 11 are formed on the supporting substrate 10 by bridge processing the sheet metal, mechanical strength of the supporting substrate 10 can be held, and defection of the supporting substrate 10 can be suppressed.

In the present example, a plurality of the second contact parts 112(1) and 112(2) are formed on one rail structure body 11. Therefore, the rail structure bodies 11 can support the canisters 4, in contact with the canisters 4 in a larger area.

In the present example, the connection part 113 nearest to the opening-part side out of a plurality of the connection parts 113 of the rail structure body 11F at the opening part side is formed in a shape diagonally facing the second contact part 112 from the first contact part 111. Therefore, the connection part 113 at the opening part side can function as a guide part to the path 115 at the time of fitting the canisters 4.

In the present example, the second contact part 112(2) at the coupling substrate 5 side is formed on the rail structure body 11R at the coupling substrate 5 side. Therefore, at the time of fitting the canister 4, the canister 4 can be positioned between the second contact part 112(2) and the other first contact part 111 positioned diagonally facing the second contact part 112(2). Therefore, the connector of the hard disc drive 41 provided on the canister 4 can be accurately engaged with the connector 51 of the coupling substrate 5.

In the present example, because the plurality of rail structure bodies 11 provided longitudinally and laterally on the supporting substrate 10 are all formed in the identical shape, the mold that is used for the press processing can be shared, and manufacturing cost can be further reduced.

Example 2

A second example is explained with reference to FIG. 7 to FIG. 10. Each of the following examples including the present example corresponds to a modification of the first example. Therefore, differences from the first example are mainly explained in each of the following examples. In the present example, one stage (second contact part 112) is formed on one rail structure body 11A.

FIG. 7(a) is a diagrammatic perspective view of a base enclosure 2A in a state that the canisters 4 are removed, and FIG. 7(b) is a plan view thereof. FIG. 8(a) is a diagrammatic perspective view showing a state that the canisters 4 from which the hard disc drives 41 are removed are being mounted, and FIG. 8(b) is a diagrammatic perspective view showing a state that the canisters 4 having hard disc drives 41 are fitted to the coupling substrate 5. FIG. 9(a) is a plan view corresponding to FIG. 8(a), and FIG. 9(b) is a plan view corresponding to FIG. 8(b).

Figure 10:
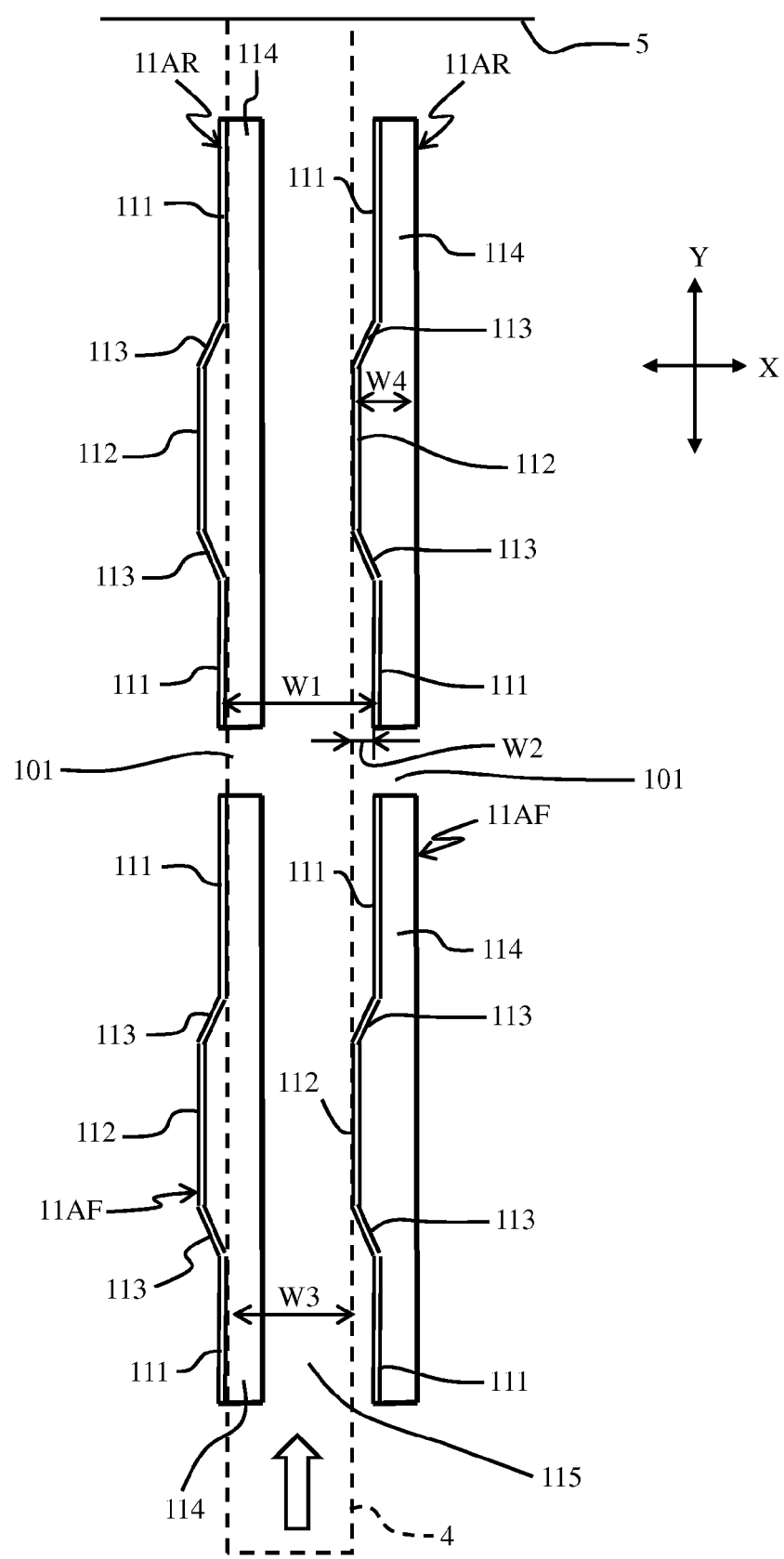
FIG. 10 is a plan view showing a plurality of adjacent rail structures.

FIG. 10 shows the rail structure bodies 11A of the present example. The rail structure bodies 11A of the present example are also formed by bridge processing a sheet metal. A set of rail structure bodies are configured by front-side rail structure bodies 11AF positioned at the opening part side, and rear-side rail structure bodies 11AR positioned at the coupling substrate side. The path 115 through which the canister 4 passes at an insertion-and-removal time is formed of a pair (two sets) of the rail structure bodies 11A adjacent in the left-and-right direction (X-axis direction).

In one rail structure body 11A, one second contact part 112 is formed near a center part in the longitudinal direction of the rail structure body 11A. Both ends of a single second contact part 112 are brought into contact with the first contact parts 111 by the connection parts 113.

Also in the present example configured in this way, in the left-and-right pair of rail structure bodies 11A, the canisters 4 can be supported in surface contact from both sides by the second contact part 112 and the first contact part 111.

Further, in the present example, because only one second contact part 112 is formed, a shape of the mold for bridge processing can be simplified as compared with the first example, and manufacturing cost can be reduced.

Example 3

Figure 11:
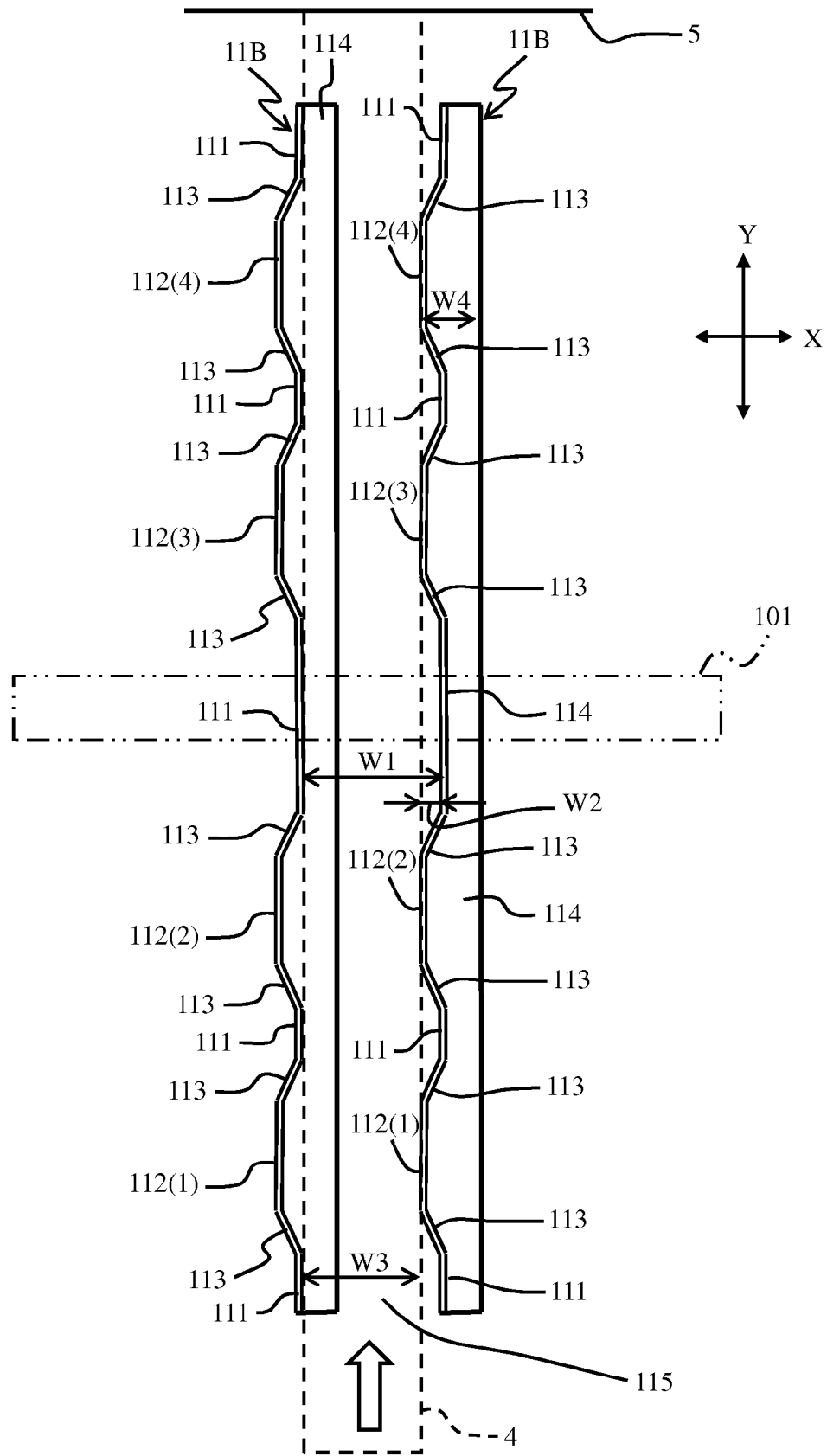
FIG. 11 relates to a third example, and is a plan view showing a plurality of adjacent rail structures.

A third example is explained with reference to FIG. 11. In the present example, the two rail structure bodies 11 longitudinally arranged spaced apart from each other as explained in the first example are made continuous, thereby forming one rail structure body 11B. That is, in the present example, the coupling part 101 that is provided to cross the left-and-right pair of rail structure bodies is not present.

Also in the present example configured in this way, substantially similar effects of the first example can be obtained. Further, in the present example, because a long rail structure body 11B extended from the opening part 23 side to the coupling substrate side is formed, the number of molds can be reduced, and manufacturing cost can be suppressed.

Example 4

Figure 12:
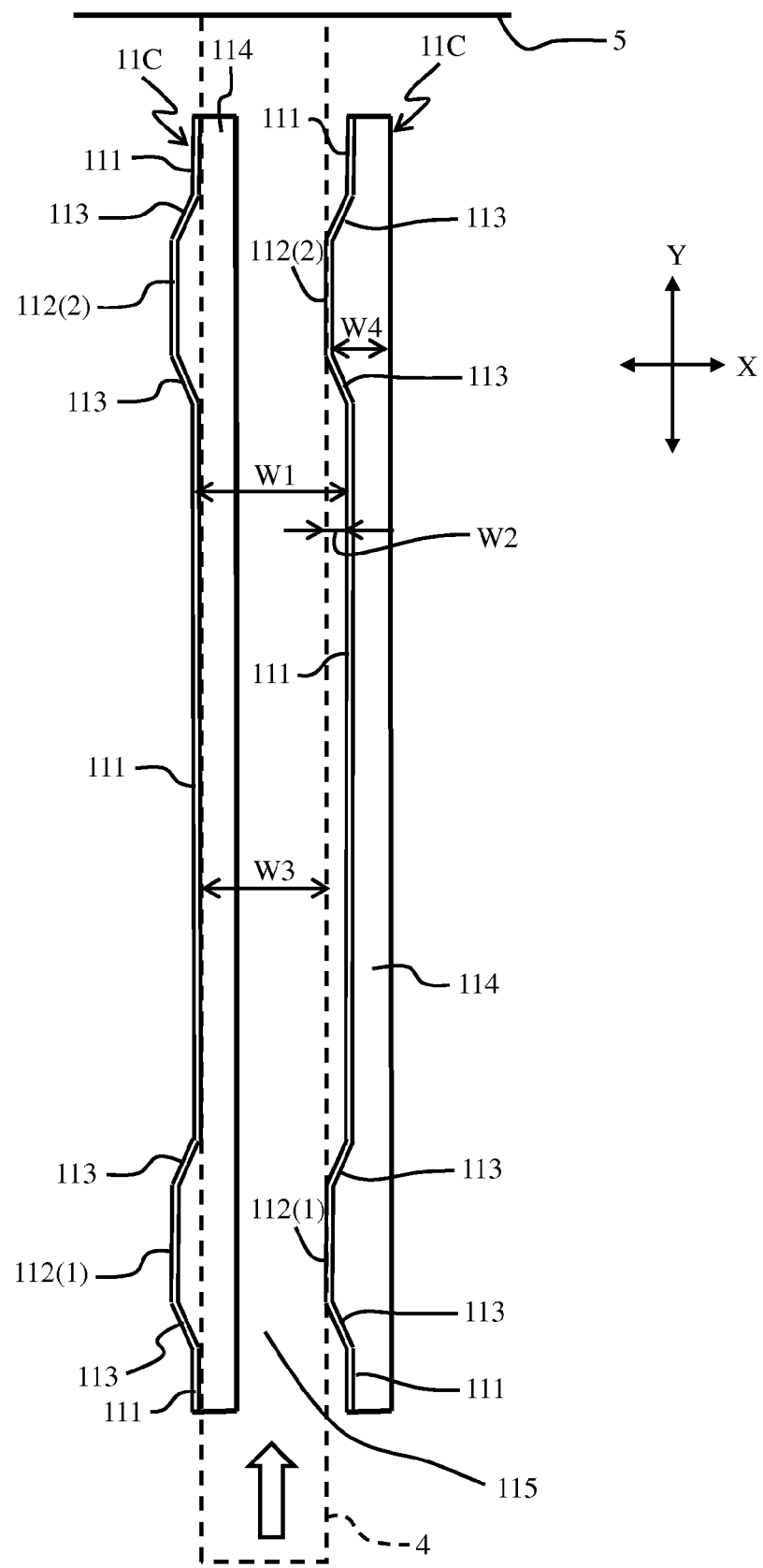
FIG. 12 relates to a fourth example, and is a plan view showing a plurality of adjacent rail structures.

A fourth example is explained with reference to FIG. 12. In the present example, in a similar manner to that described in the third example, a long rail structure body 11C extended from the opening part 23 side to the coupling substrate 5 side is formed. However, in the present example, unlike in the third example, one second contact part 112 is formed at each of the opening part side and the coupling substrate side. Only the first contact part 111 is formed between the second contact part 112(1) at the opening part side and the second contact part 112(2) at the coupling substrate 5 side.

Also in the present example configured in this way, similar effects of the third example can be obtained. Further, in the present example, because the number of the second contact parts 112 can be reduced, manufacturing cost can be reduced.

The present invention is not limited to the above-described examples. Persons skilled in the art concerned can perform various additions and alterations within the range of the present invention. For example, the second contact parts and the canisters may be configured to be in a line contact or a point contact, by forming the second contact parts not in a plate shape but in a sign curve or a triangular wave shape. Further, the present invention can be also applied to a server having a configuration that canisters having storage media are insertable and removable, not only to the storage apparatus.

Further, a plurality of the second contact parts are not required to have an identical shape, but may have different shapes. For example, the configuration may be such that the second contact parts at the opening part side are formed in a planar shape, and the second contact parts at the coupling substrate side are formed in a shape other than a planar shape such as an arc shape and a triangular shape.

Further, the characteristics described in claims can be also subordinated in other areas than a range described in claims.

REFERENCE SIGNS LIST 1 rack
2 base enclosure
3 Expansion Enclosure
4 canister
5 coupling substrate
6 control substrate
7 power source apparatus
10 supporting substrate
11, 11F, 11R, 11AF, 11AR, 11B, 11C rail structure bodies
101 coupling part
111 first contact part
112 second contact part
113 connection part
114 through-hole
115 path

The invention claimed is:

1. A storage apparatus comprising: an enclosure having an opening part on an end at one side in a first direction; a supporting substrate which is provided in the enclosure and to which at least one canister for housing storage media is insertably and removably fitted; and supporting structures spaced apart by a first predetermined distance in a second direction orthogonal with the first direction on a same plane, integrally formed on the supporting substrate in parallel with the first direction, and configured to support the canister that is inserted and removed via the opening part, wherein each of the supporting structures includes: a first contact part extended in parallel with the first direction; a second contact part continuously and integrally formed with the first contact part so as to be protruded by a second predetermined distance toward one side in the second direction; and a coupling part positioned at both ends of the second contact part in the first direction, continuously and integrally formed with the first contact part and the second contact part, and configured to couple the first contact part to the second contact part, and the canister is configured to be supported between one side surface of the second contact part of one supporting structure and the other side surface of the first contact part of the other supporting structure adjacent to the one supporting structure, the first contact part and the second contact part are formed in flat plate shapes, and one side surface of the second contact part of the one supporting structure and the other side surface of the first contact part of the other supporting structure are in surface contact with the canister to support the canister.

2. The storage apparatus according to claim 1, wherein a coupling part positioned nearest to the opening part side out of a plurality of the coupling parts is configured as a guide part which guides an opposite end to the opening part of the canister that is inserted from the opening part in the first direction, to a path formed between one side surface of the second contact part of the one supporting structure and the other side surface of the first contact part of the other supporting structure.

3. The storage apparatus according to claim 2, wherein a plurality of the supporting structures are provided on the supporting substrate so as to be spaced apart from each other in the first direction.

4. The storage apparatus according to claim 3, wherein a plurality of the second contact parts are provided on the first contact part so as to be spaced apart from each other in the first direction.

5. The storage apparatus according to claim 1, wherein the supporting substrate is formed of a thin metal sheet, and the supporting structure is integrally formed on the supporting substrate by pressing the supporting substrate with a mold having a predetermined shape.

6. The storage apparatus according to claim 5, wherein
the enclosure houses the canister in one side area in the first direction, and houses a control substrate in the other side area in the first direction,
a coupling substrate for electrical connection is provided between the canister and the control substrate, in a third direction orthogonal with the first direction and the second direction, and
the storage media housed in the canister is electrically connected to the control substrate when the canister is mounted on the enclosure.

7. The storage apparatus according to claim 6, wherein a second contact part positioned nearest to the coupling substrate side out of a plurality of the second contact parts is configured as a positioning part for positioning when fitting the canister to the coupling substrate, in cooperation with a corresponding first contact part of the other supporting structure.

* * * * *